(12) United States Patent
Tikka et al.

(10) Patent No.: US 7,616,079 B2
(45) Date of Patent: Nov. 10, 2009

(54) BULK ACOUSTIC WAVE RESONATOR AND CIRCUIT COMPRISING SAME

(75) Inventors: Pasi Tikka, Munich (DE); Ralph Stömmer, Neuhiberg (DE); Edgar Schmidhammer, Stein (DE); Michael Unterberger, Unterhaching (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/530,507

(22) PCT Filed: Sep. 18, 2003

(86) PCT No.: PCT/EP03/10431

§ 371 (c)(1),
(2), (4) Date: Apr. 6, 2005

(87) PCT Pub. No.: WO2004/034579

PCT Pub. Date: Apr. 22, 2004

(65) Prior Publication Data

US 2006/0164183 A1    Jul. 27, 2006

(30) Foreign Application Priority Data

Oct. 8, 2002    (DE) ............................... 102467919

(51) Int. Cl.
*H03H 9/205*    (2006.01)
*H03H 9/54*    (2006.01)

(52) U.S. Cl. ................... 333/189; 333/190; 333/192

(58) Field of Classification Search .......... 333/187–192
See application file for complete search history.

(56) References Cited

U.S. PATENT DOCUMENTS 1,959,429 A * 5/1934 Hovgaard ................... 333/189
5,821,833 A   10/1998 Lakin ......................... 333/187
6,472,954 B1 * 10/2002 Ruby et al. .................. 333/133

(Continued)

FOREIGN PATENT DOCUMENTS

DE    101 49 542 A1 *  4/2003

(Continued)

OTHER PUBLICATIONS

Penunuri et al.; "RF Filter Design Using LTCC And Thin Film BAW Technology"; 2001 IEEE Ultrasonics Symposium; vol. 1, Oct. 2001, pp. 273-278.*

(Continued)

*Primary Examiner*—Barbara Summons
(74) *Attorney, Agent, or Firm*—Fish & Richardson P.C.

(57) ABSTRACT

The invention relates to a resonator operating with bulk acoustic waves (BAW resonator, BAW=Bulk Acoustic Wave) and band-pass filters constructed of such resonators. To increase the edge steepness of the transmission band of a BAW band-pass filter, the invention proposes reducing the effective coupling of a BAW resonator by using the connection in parallel of a BAW resonator and a capacitor instead of only one resonator. In addition, to increase the edge steepness of the transmission band, the use of a connection of coupled BAW resonators in the serial branch of a filter circuit with another resonator or resonator stack in the parallel branch of the filter circuit is proposed, the additional resonator or resonator stack being connected to the center electrode of the resonator stack specified initially.

18 Claims, 6 Drawing Sheets

U.S. PATENT DOCUMENTS

| | | | |
|---|---|---|---|
| 6,515,558 B1 * | 2/2003 | Ylilammi | 333/189 |
| 6,548,942 B1 * | 4/2003 | Panasik | 310/364 |
| 6,653,913 B2 * | 11/2003 | Klee et al. | 333/188 |
| 6,885,260 B2 * | 4/2005 | Nishimura et al. | 333/133 |
| 6,927,649 B2 * | 8/2005 | Metzger et al. | 333/133 |
| 6,943,484 B2 * | 9/2005 | Clark et al. | 310/334 |
| 6,975,183 B2 * | 12/2005 | Aigner et al. | 333/187 |
| 7,194,247 B2 * | 3/2007 | Tikka et al. | 455/339 |
| 2001/0048352 A1 * | 12/2001 | Klee et al. | 333/188 |
| 2002/0084873 A1 | 7/2002 | Ella et al. | |
| 2003/0067368 A1 * | 4/2003 | Ohara et al. | 333/188 |

FOREIGN PATENT DOCUMENTS

| | | |
|---|---|---|
| EP | 0 949 756 | 10/1999 |
| EP | 1 227 582 A2 | 7/2002 |
| GB | 2 365 639 | 2/2002 |
| JP | 55127720 | 10/1980 |
| JP | 08018392 | 1/1996 |
| JP | 2002-217676 * | 8/2002 |
| WO | WO 02/093763 * | 11/2002 |

OTHER PUBLICATIONS

K. M. Lakin et al "High Performance Stacked Crystal Filters for GPS and Wide Bandwidth Applications", IEEE Ultrasonics Symposium Paper 3E-6 Oct. 9, 2001.

* cited by examiner

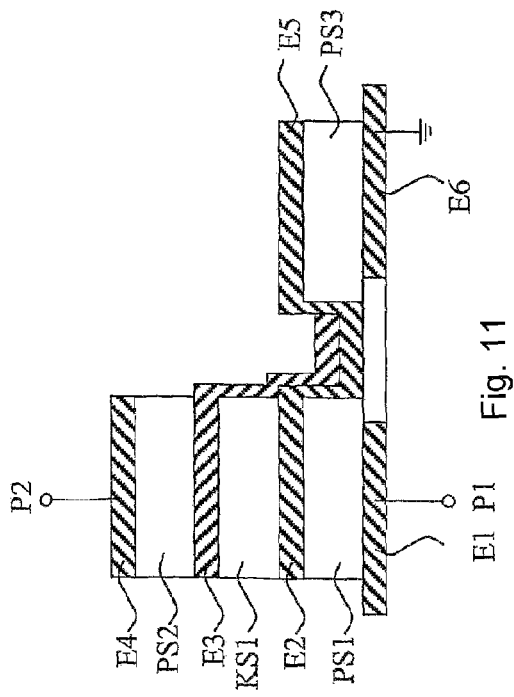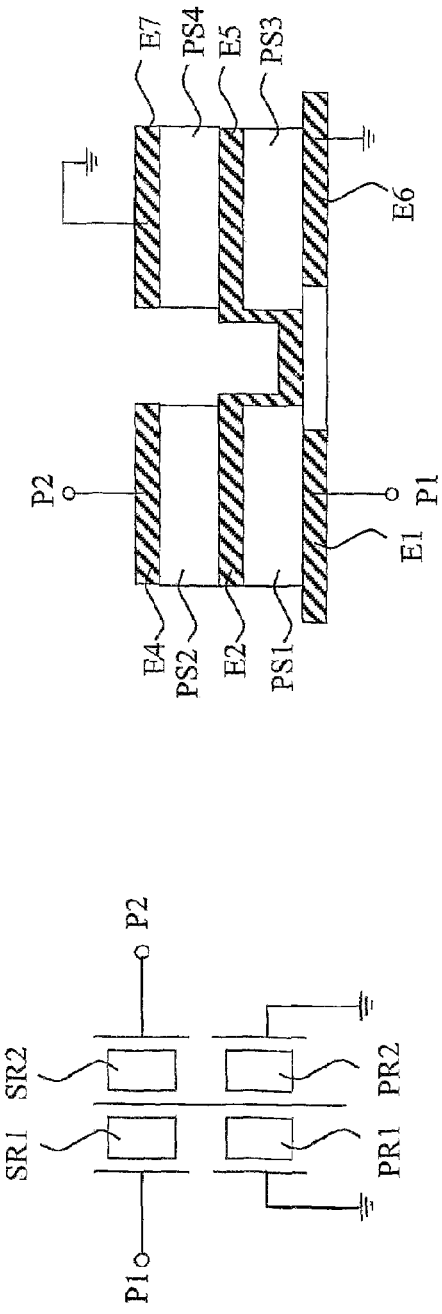

BULK ACOUSTIC WAVE RESONATOR AND CIRCUIT COMPRISING SAME

TECHNICAL FIELD

This patent application describes a resonator operating with bulk acoustic waves (or FBAR, Thin Film Bulk Acoustic Wave Resonator), also known as BAW resonator (Bulk Acoustic Wave Resonator), as well as a circuit constructed of such resonators.

BACKGROUND

BAW resonators are suitable, in particular, for band-pass high-frequency filters in modern filter technology, and can be used, for example, in mobile communication devices.

A resonator operating with bulk acoustic waves has a piezoelectric layer that is disposed between two metal layers (electrodes). A sequence of layers can also be used instead of only one piezoelectric layer. The layers are deposited consecutively on a substrate and structured into resonators, that are electrically connected to one another and together can constitute, for example, a filter circuit especially a band-pass filter. Such a band-pass filter can also be used together with another filter in a duplexer.

FIG. 1 shows the equivalent circuit diagram of a BAW resonator. Outside a frequency range surrounding the resonant frequency, the resonator is characterized by a static capacitor $C_0$ and, in proximity to the resonant frequency, by the series connection of a resistor $R_m$, a capacitor $C_m$ and an inductive resistor $L_m$. The static capacitor is essentially defined by the resonator surface area and the thickness of the piezoelectric layer. The resistor $R_m$ describes losses in the resonator, while the capacitor $C_m$ and the inductive resistor $L_m$ determine the resonant frequency $$f_r = \frac{1}{2\pi\sqrt{L_m C_m}}.$$

The ratio $C_m/C_o$ determines the coupling of the resonator. The coupling coefficient k of the resonator is linked to the resonant frequency $f_r$ and the antiresonant frequency $f_a$:

$$k^2 = \frac{f_a^2 - f_r^2}{f_a^2},$$

wherein $f_o = f_m\sqrt{1+C_m/C_o}$.

A band-pass filter is characterized by a transfer function that has, in particular, a pass band and several stop bands. The pass band is, in turn, characterized by its bandwidth, the insertion attenuation in the pass band and the edge steepness at the edge of the pass band.

Two BAW resonators SR1 and SR2 (as depicted schematically in FIG. 2) can be acoustically coupled with one another if, for example, they are arranged in a stack one on top of the other. In this connection, the resonators form a series connection between a port P1 and a port P2, e.g., in a stacked-crystal arrangement, in which two resonators share a common electrode, that is connected to ground (see FIG. 3), or are arranged in a coupled-resonator arrangement, in which a coupling layer KS is arranged between the upper electrode E2 of the lower resonator and the lower electrode E3 of the upper resonator, and said electrodes are connected to ground (see FIG. 4). A first resonator in FIG. 3 comprises a piezoelectric layer PS1, that is arranged between two electrodes E1 and E2, and an acoustic mirror AS arranged below the electrode E1, said acoustic mirror resting on a carrier substrate TS. Above the first resonator, a second resonator is arranged that comprises a piezoelectric layer PS2, which is arranged between the electrode E2 and an electrode E3. Electrode E1 is connected to port P1, electrode E3 to port P2 and electrode E2 to ground.

The layer system shown in FIG. 4 includes a first resonator arranged on a carrier substrate TS, a coupling layer KS disposed above it and a second resonator arranged above the coupling layer KS. The first resonator is arranged as described in FIG. 3 and is connected between port P1 and ground. The second resonator contains (from bottom to top) two electrodes E3 and E4 and a piezoelectric layer PS2 arranged between said electrodes, the second resonator being connected between port P2 and ground. The coupling layer KS arranged between said resonators provides for acoustic coupling between these resonators.

Filters constructed of acoustically coupled resonators are characterized by a high stop band suppression. However, the edge steepness and, with it, the adjacent channel selectivity are comparatively low, due to the absence of defined pole positions in proximity to the pass band.

BAW resonators can be connected in a ladder-type or a lattice-type construction. The advantage of the lattice-type arrangement of the resonators in a band-pass filter is that the selection of such a filter in stop band areas well outside the pass band is very good, ranging, for example, between −40 and −60 dB. The disadvantage of this filter arrangement includes a low edge steepness of the pass band. For this reason, it may be difficult, in this type of filter arrangement, to achieve sufficient attenuation of the signal in the stop bands in proximity to the pass band.

Considerable edge steepness is required in some applications. In the case of duplexers that are suitable for the PCS telecommunications standard, for example, a decline in the transmission function from ca. −3 dB to significantly below −40 dB within a frequency range of only 20 MHz must be guaranteed. Previously known band-pass filters that are constructed of BAW resonators may not satisfy such requirements, due to additional frequency shifts in the edges in response to temperature change or as a result of existing production tolerances (which, in the case of a filter operating at ca. 2 GHz and having BAW resonators that contain a piezoelectric layer of ALN, can amount to several MHz).

It is known, from the reference EP 0949756 A2, that a series connection of stacked resonators acoustically coupled with one another, as well as additional resonators instead of only one resonator in a filter circuit, improves edge steepness in the transmission band of the filter. The disadvantage of this solution, however, is that it requires a great deal of space.

SUMMARY

This patent application describes a resonator operating with bulk acoustic waves (also known as BAW resonator—Bulk Acoustic Wave Resonator—or FBAR—Thin Film Bulk Acoustic Wave Resonator), which is constructed of a sequence of layers containing the following layers: a lower layer region that comprises a first electrode, an upper layer region that comprises a second electrode and, between the two, a piezoelectric layer. A capacitor is connected in parallel or in series to the resonator.

The parallel connection of a BAW resonator and a capacitor $C_a$ instead of a non-connected resonator reduces the effective coupling of the BAW resonator (that is, the distance between the resonant and antiresonant frequency of the resonator), in that the effective static capacitance $C'_0$ is increased, $C'_0 = C_0 + C_0$. In this connection, the resonant frequency $f'_r$ of the new circuit (series resonance, or the resonant frequency of the series resonant circuit formed by $C_m$, $L_m$ and $R_m$) remains unchanged relative to the resonant frequency $f_r$ of the (non-connected) resonator, $f'_r = f_r$. In contrast, the antiresonant frequency $f_a = f_m\sqrt{1+C_m/C'_o}$ (parallel resonance, or the resonant frequency of the parallel resonant circuit formed by $C'_0$, $C_m$, $L_m$ and $R_m$) is lower than the antiresonant frequency $f_a = f_m\sqrt{1+C_m/C_o}$ (parallel resonance, or the resonant frequency of the parallel resonant circuit formed by $C_0$, $C_m$, $L_m$ and $R_m$) of the (non-connected) resonator. As a result, the edge steepness of a band-pass filter comprising such BAW resonators is increased.

The series connection of a BAW resonator and a capacitor $C_a$ instead of a non-connected resonator reduces the effective coupling of a BAW resonator (that is, the distance between the resonant and the antiresonant frequency of the resonator). In the connection, the antiresonant frequency $f'_a$ of the circuit (parallel resonance, or the resonant frequency of the parallel resonant circuit formed by $C_0$, $C_m$, $L_m$ and $R_m$) remains unchanged relative to the antiresonant frequency $f_a$ of the resonator, $f'_a = f_a$. In contrast, the resonant frequency $f'_m = f_m\sqrt{1+C_m(C_o+C_a)}$ (series resonance, or the resonant frequency of the series resonant circuit formed by $C_0$, $C_m$, $L_m$ and $R_m$) of the circuit is higher than the resonant frequency $f_r$ (series resonance, or the resonant frequency of the serial resonant circuit formed by $C_m$, $L_m$ and $R_m$) of the resonator. As a result, the edge steepness of a band-pass filter comprising such BAW resonators is increased.

In an embodiment, the resonator is arranged on a carrier substrate. It is also possible to arrange the resonator over an air gap provided in the carrier substrate.

The first and the second electrode may include an electrically conductive material, such as a metal or a metal alloy.

The piezoelectric layer may include AlN, but can include another material with piezoelectric properties (such as ZnO). It is also possible that the piezoelectric layer comprises a plurality of adjacent or separated, identical or different layers with piezoelectric properties.

It is possible that the first and/or the second electrode has a multilayer structure comprised of two or more adjacent layers of different materials. It is also possible that the piezoelectric layer in the resonator comprises two or more adjacent or separated layers of different materials.

It is possible that, additionally, a layer resistant to dielectric discharge is arranged between the first and the second electrode, where the layer protects the resonator against electric arcing between the electrodes.

The connection of a capacitor in parallel to a BAW resonator can be accomplished in a filter constructed, for example, in a ladder-type construction, in a lattice-type construction or as an SCF (Stacked Crystal Filter), as well as of any combination of BAW resonators.

It is possible to provide for the connection of a capacitor in parallel to a BAW resonator in only one series branch or in a plurality of series branches of a filter. It is also possible to provide for the connection of a capacitor in parallel to a BAW resonator in only one parallel branch or a plurality of parallel branches of a filter. In a further embodiment, it is possible that the connection of a capacitor in parallel to a BAW resonator be provided in at least one series branch or in at least one parallel branch of the filter.

In embodiments, the value of the capacitor connected in parallel to a BAW resonator may be between 0.1 and 10 pF.

It is advantageous when the coupling of the resonator is reduced only in the series branches or only in the parallel branches of a filter or a duplexer by the parallel connection of the corresponding capacitors.

It is possible to implement the capacitor connected in parallel to a BAW resonator by connecting a discrete capacitor in parallel to the BAW resonator. Another possibility is to realize such a capacitor in the carrier substrate by structured metal layers. It is also possible to arrange an additional dielectric layer between the electrodes of the BAW resonator to increase the capacitance of the BAW resonator. This dielectric layer can be arranged between the piezoelectric layer and one of the electrodes or between two piezoelectric layers.

The parasitic capacitance of the respective resonator can also be deliberately selected to be as large as possible, for example by enlarging the electrode surface to improve the edge steepness of the filter constructed of such resonators. Other implementations not cited here are also possible.

It is possible that the lower and/or upper layer region of the resonator may include one or more layers. It is also possible that an acoustic mirror is realized in the lower and/or in the upper layer region, where the mirror comprises at least two alternating layers having different acoustic impedance.

The acoustic mirror may comprise alternating layers, each having a high and a low acoustic impedance, each of their layer thicknesses comprising approximately a quarter wavelength of the acoustic main mode (relative to the velocity of expansion of the acoustic wave in the respective material). The acoustic mirror thus provides one and/or a plurality of boundary surfaces, that, at the resonant frequency, reflect the acoustic wave back into the resonator and prevent the wave from escaping in the direction of the carrier substrate.

In a further advantageous embodiment, one of the layers of the acoustic mirror can simultaneously constitute one of said electrodes.

The use of a BAW resonator with a capacitor connected in parallel in the circuit of a band-pass filter increases the edge steepness of the transmission band of the band-pass filter. As a result, the attenuation of the signal is increased in the stop bands in proximity to the pass band. This is advantageous in the case of realization of a duplexer circuit having such a band-pass filter.

Another embodiment includes an electric circuit containing a resonator stack that comprises at least two resonators arranged one on top of the other and operating with bulk acoustic waves and at least one additional resonator or resonator stack having BAW resonators. Each of the resonators operating with bulk acoustic waves comprises a lower electrode, an upper electrode and a piezoelectric layer arranged between the two. In this connection, the resonators arranged one on top of the other in the resonator stack form a series circuit, e.g., in a stacked crystal arrangement (when both resonators have a shared electrode) or a coupled resonator arrangement (when a coupling layer is provided between the upper electrode of the lower resonator and the lower electrode of the upper resonator).

The upper electrode of the lower resonator operating with bulk acoustic waves and the lower electrode of the upper resonator operating with bulk acoustic waves, said electrodes being arranged in the resonator stack, are electrically connected here to one of the electrodes of at least one additional resonator or resonator stack.

The connection can be viewed as a basic element of a ladder-type arrangement or (in the case of a suitable connection) of a lattice-type arrangement of individual resonators, at least two of the resonators being acoustically coupled with one another and arranged one on top of the other. It is possible that two BAW resonators arranged one on top of the other in a stack realize here two series resonators or parallel resonators of the ladder-type arrangement or of the lattice-type arrangement. It is also possible that two BAW resonators arranged one on top of the other in a stack realize one series resonator and one parallel resonator of the ladder-type arrangement or the lattice-type arrangement.

A coupling layer may be provided between the upper electrode of the lower resonator operating with bulk acoustic waves and the lower electrode of the upper resonator operating with bulk acoustic waves, said electrode being arranged in the resonator stack.

The at least one additional resonator can, for example, be a resonator with bulk acoustic waves, a resonator operating with surface acoustic waves, an LC resonator or a resonator stack as specified above.

The second electrode of the at least one additional resonator, said electrode not being connected to the resonators arranged one on top of the other in the resonator stack, can be connected to ground or to a subsequent resonator and/or to a resonator stack not yet specified.

The circuit represents an advantageous combination of different filter arrangements, such as the arrangement of the resonators stacked one on top of the other and acoustically coupled with one another, as well as a ladder-type arrangement and/or a lattice-type arrangement. The transfer function of a filter whose basic elements realize the circuit, as compared with the transfer function of a filter constructed of resonator stacks known in the art, exhibits significantly steeper edges in the pass band of the filter. This results in good adjacent channel selectivity of the filter.

The circuit that includes a resonator stack and a resonator electrically connected to it as specified above may comprise a basic element of a filter.

It is possible that a plurality of parallel resonators, each of which is arranged in a parallel branch of different basic elements electrically connected to one another, are acoustically connected to one another and/or arranged one on top of the other. It is also possible that, instead of only one resonator being realized in the parallel branch (parallel resonator) of a basic element of the circuit, two (e.g., coupled with one another) parallel resonators connected in series or in parallel are realized.

It is also possible that more than only two series resonators are arranged one on top of the other and/or acoustically coupled with one another.

The basic elements of the described above can be combined with one another in any manner.

In the following, embodiments are explained in greater detail on the basis of figures that are schematic and, therefore, not true to scale.

DESCRIPTION OF THE DRAWINGS

FIG. 11 shows an advantageous embodiment of a connection of a resonator stack and of an additional BAW resonator in schematic cross-section.

FIG. 12 shows a connection of a resonator stack in the series branch and of an additional resonator stack in the parallel branch, in circuit diagram (a) and in schematic cross-section (b), respectively.

DETAILED DESCRIPTION

Figure 1:
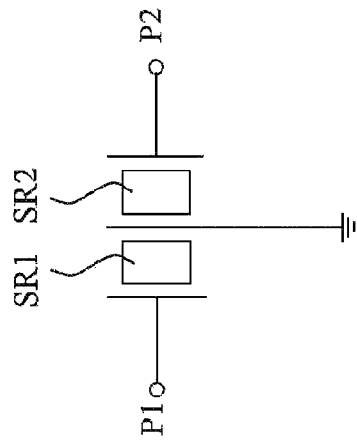
FIG. 1 shows an equivalent circuit diagram of a BAW resonator.
Figure 2:
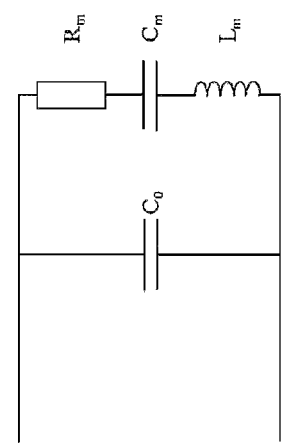
FIG. 2 shows the circuit diagram of a resonator stack.
Figure 3:
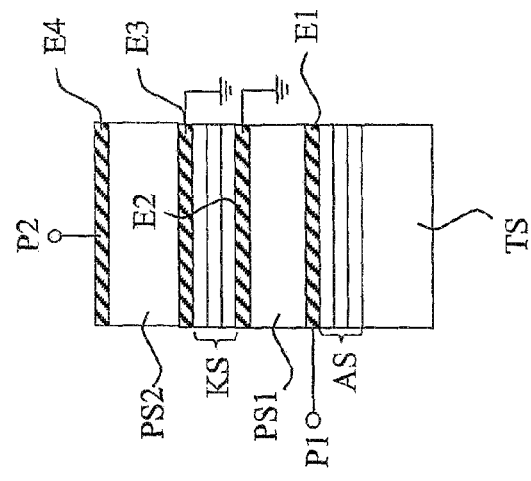
FIG. 3 shows a resonator stack with acoustically coupled BAW resonators in schematic cross-section (state of the art).
Figure 4:
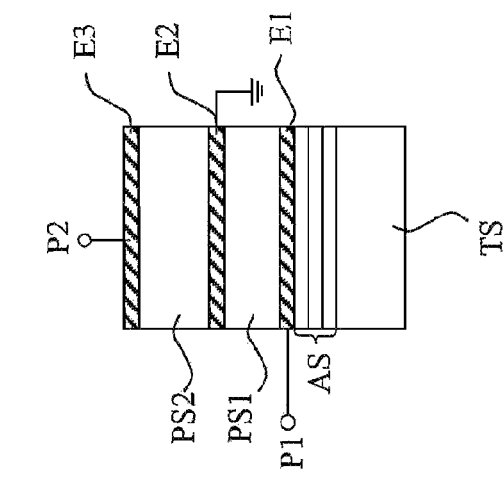
FIG. 4 shows another example of a resonator stack with acoustically coupled BAW resonators and a coupling layer in schematic cross-section (state of the art).
Figure 5A:
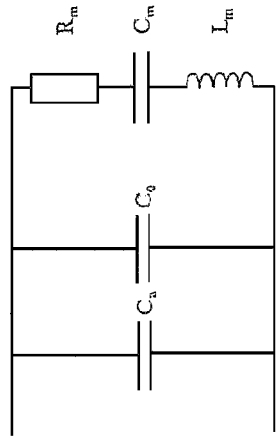
FIG. 5a shows an equivalent circuit diagram of a BAW resonator with a capacitor connected in parallel.

FIGS. 1 to 4 have already been discussed earlier. FIG. 5a shows an equivalent circuit diagram of a BAW resonator with a capacitor $C_a$ connected in parallel to it. Outside the resonant frequency range, the resonator includes a static capacitor $C_0$ and, in proximity to the resonant frequency, by a resistor $R_m$, a capacitor $C_m$ and an inductive resistor $L_m$. The resistor $R_m$ describes losses in the resonator, while the capacitor $C_m$ and the inductive resistor $L_m$ determine the resonant frequency. The ratio $C_m/C_0$ determines the coupling of the resonator. The addition of a capacitor $C_a$ connected in parallel to the resonator results in reduction of the effective coupling of the resonator determined by $C_m/(C_0+C_a)$, instead of $C_m/C_0$.

Figure 5B:
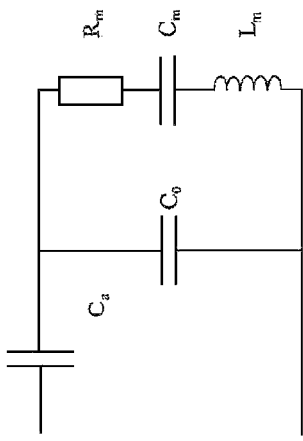
FIG. 5b shows an equivalent circuit diagram of a BAW resonator with a capacitor connected in series.

FIG. 5b shows an equivalent circuit diagram of a BAW resonator with a capacitor $C_a$ connected in series to it.

Figure 6A:
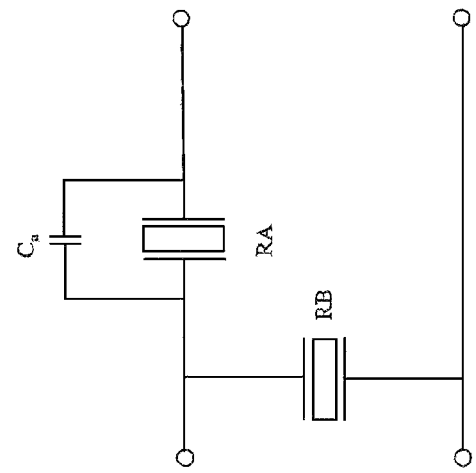
FIG. 6a shows a basic element of a filter realized in ladder-type construction with a capacitor connected in parallel to a BAW resonator in the series branch.

An example of a connection of two BAW resonators RA and RB in ladder-type construction and a capacitor $C_a$ connected in parallel to one of the resonators is shown in FIG. 6a. Resonator RA is arranged in a series branch and resonator RB in a parallel branch of the circuit. Two resonators connected in this manner represent, for example, a basic element of a ladder-type filter known in the art.

In FIG. 6a, the capacitor $C_a$ is integrated in the series branch of the circuit. In this connection, it is connected in parallel to the series resonator RA, as a result of which the steepness of the right edge of the transfer function in the pass band can be controlled or increased. Such a basic element can be used, for example, in the transmission filter (Tx filter) of a duplexer, especially a PCS duplexer.

Figure 6B:
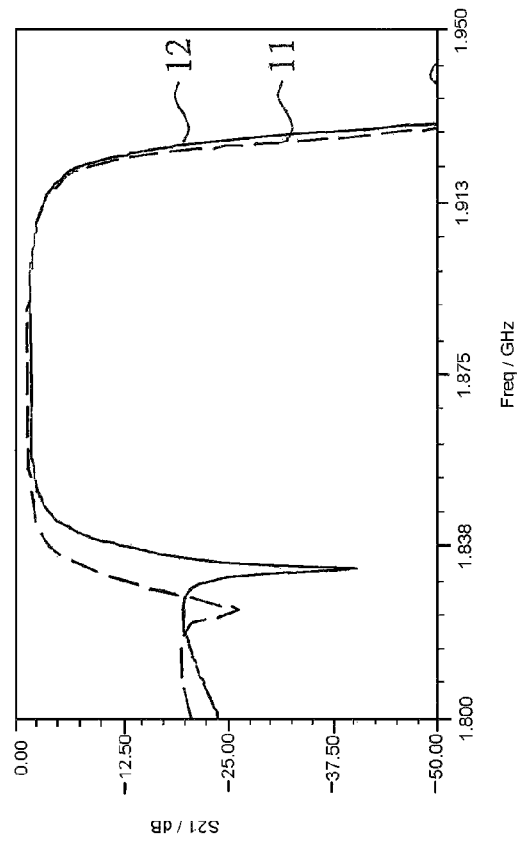
FIG. 6b shows the transfer function of a filter realized in ladder-type construction without and with a capacitor connected in parallel to a BAW resonator in the series branch.

FIG. 6b shows the transfer function S21 of a filter realized in ladder-type construction without and with a capacitor connected in parallel to a BAW resonator in the series branch. The transfer function of the filter constructed of BAW resonators in the ladder-type construction known in the art is indicated by a dashed line 11. The transfer function of the filter in ladder-type construction with a capacitor connected in parallel to a BAW resonator in the series branch is indicated by a continuous line 12, wherein the transfer function, in this case, has a steeper right edge of the pass band.

Figure 7:
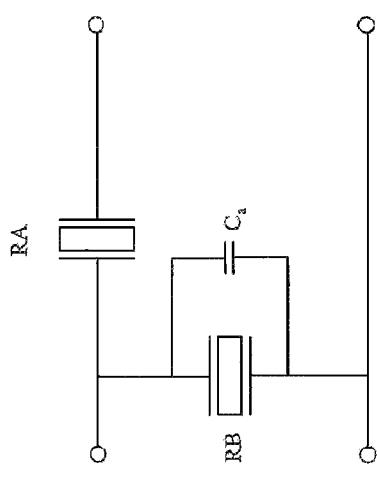
FIG. 7 shows a basic element of a filter realized in ladder-type construction with a capacitor connected in parallel to a BAW resonator in the parallel branch.

In FIG. 7, the capacitor $C_a$ is integrated in the parallel branch of the circuit. It is connected in parallel to the parallel resonator RB, as a result of which the steepness of the left edge of the transfer function in the pass band can be controlled and/or increased. Such a basic element can be used, for example, in the reception filter (Rx filter) of a duplexer, especially a PCS duplexer.

The capacitor $C_a$ can be arranged on a carrier substrate, together with the BAW resonator. The capacitor $C_a$ can also constitute a discrete component with external electrodes, said component being electrically connected to the BAW resonator as described above.

It is also possible that the capacitor $C_a$ is realized in the metallized layers of the (multilayer) carrier substrate and, as described above, is electrically connected to the BAW resonator by, for example, feedthroughs, bump connectors or bond wires.

Figure 8B:
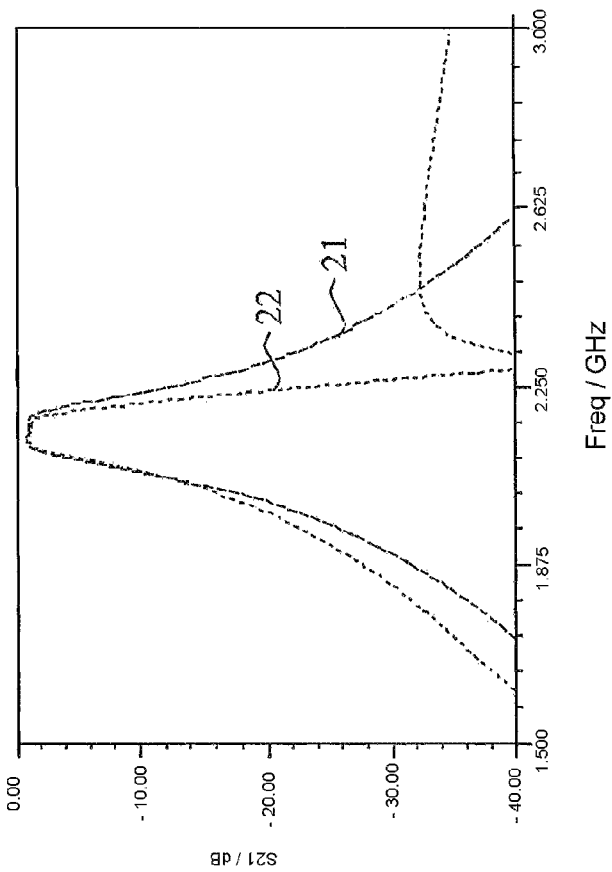
FIG. 8b shows the transfer function of a filter realized in lattice-type construction without and with a capacitor connected in parallel to a BAW resonator in the series branch.
Figure 8A:
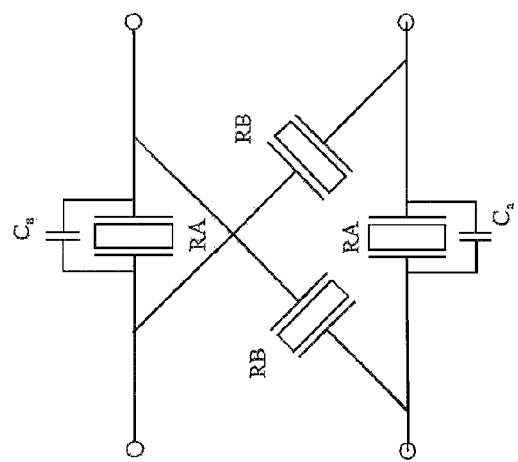
FIG. 8a shows an embodiment of a filter realized in ladder-type construction with capacitors connected in parallel to BAW resonators in the serial branches.

An example of a connection of two BAW resonators RA and RB in lattice-type construction and a capacitor $C_a$ connected in parallel to one of said resonators is shown in FIG. 8a. A resonator RA is arranged in a series branch, and a resonator RB in a parallel branch of the circuit. FIG. 8a shows two pairs of resonators that are connected in this manner and this constitutes, for example, a basic element of a filter realized in lattice-type construction.

In FIG. 8a, two capacitors $C_a$ are each integrated in a series branch of the circuit. They are each connected in parallel to the corresponding series resonator RA, as a result of which the steepness of the right edge of the transfer function in the pass band can be controlled and/or increased. Such a basic element can be used, for example, in the transmission filter (Tx filter) of a duplexer, especially a PCS duplexer.

FIG. 8b shows the transfer function S21 of a filter realized in lattice-type construction without and with a capacitor connected in parallel to a BAW resonator in the series branch. The transfer function of the filter constructed of BAW resonators in the lattice-type construction known in the art is indicated by a dashed line 11. The transfer function of the filter in lattice-type construction with a capacitor connected in parallel to a BAW resonator in the series branch is indicated by a continuous line 12, wherein the transfer function, in this case, has a steeper right edge of the pass band.

Figure 9:
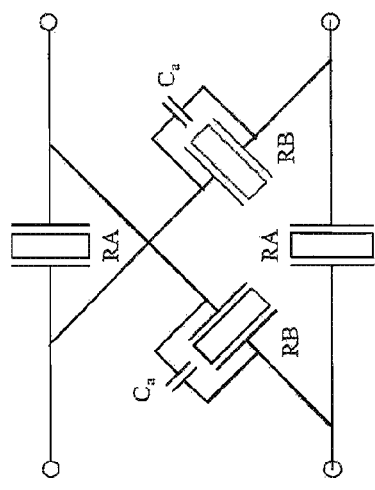
FIG. 9 shows an embodiment of a filter realized in lattice-type construction with capacitors connected in parallel to BAW resonators in the parallel branches.

In FIG. 9, two capacitors $C_a$ are each integrated in a parallel branch of the circuit. They are each connected in parallel to the parallel resonator RB, as a result of which the steepness of the left edge of the transfer function in the pass band can be controlled or increased. Such a basic element can be used, for example, in the reception filter (Rx filter) of a duplexer, especially a PCS duplexer.

Figure 10B:
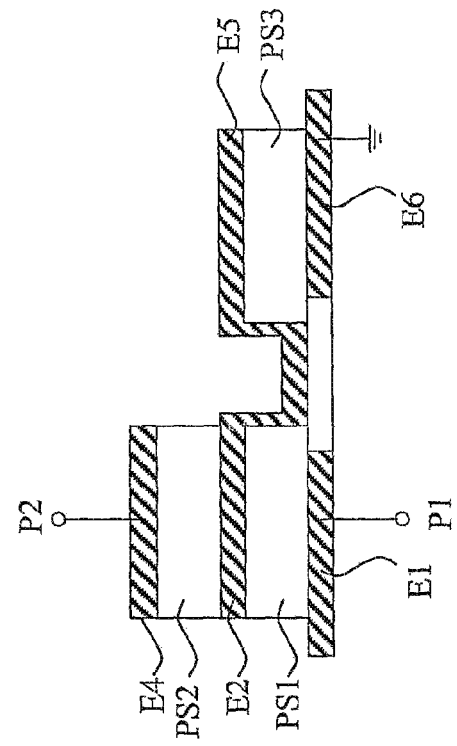
FIG. 10 shows a connection of a resonator stack in the series branch and of an additional BAW resonator in the parallel branch, in circuit diagram (a) and in schematic cross-section (b), respectively.
FIGS. 10c and 10d show LC filter arrangements.
Figure 10A:
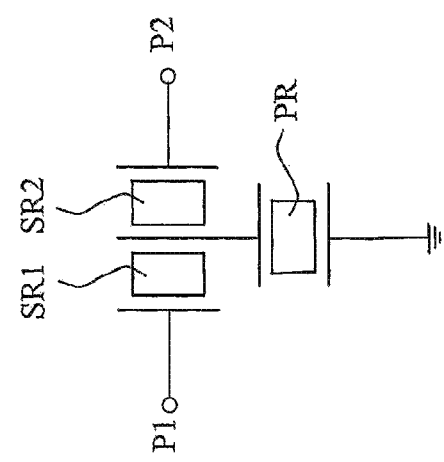

FIG. 10a shows the circuit diagram of a connection of a resonator stack, that comprises the BAW resonators SR1 and SR2, in the series branch, and of an additional BAW resonator PR in the parallel branch. The resonator stack is connected between ports P1 and P2. An example of a realization of such a circuit is shown in schematic cross-section in FIG. 10b. The resonator stack comprises the piezoelectric layer PS1, that is arranged between two electrodes E1 and E2 (center electrode). The piezoelectric layer PS2 is arranged above them. An electrode E4 connected to the port 2 lies on the piezoelectric layer PS2. The port P1 is electrically connected to the electrode E1. The layer sequence E1, PS1 and E2 realizes, for example, the resonator SR1 in accordance with FIG. 10a. The layer sequence E2, PS2 and E4 realizes, for example, the resonator SR2 in accordance with FIG. 10a. Here, the resonator PR in the parallel branch of the circuit according to FIG. 10a is realized by the layer sequence E6 (electrode), PS3 (piezoelectric layer) and E5 (electrode), the electrode E5 being electrically connected to the center electrode E2. In this embodiment, the electrode E6 is connected to ground. It is also possible that it is connected to another circuit not shown here.

Figure 10C:
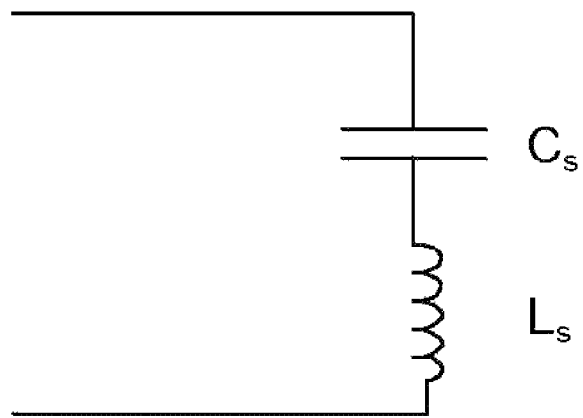
Figure 10D:
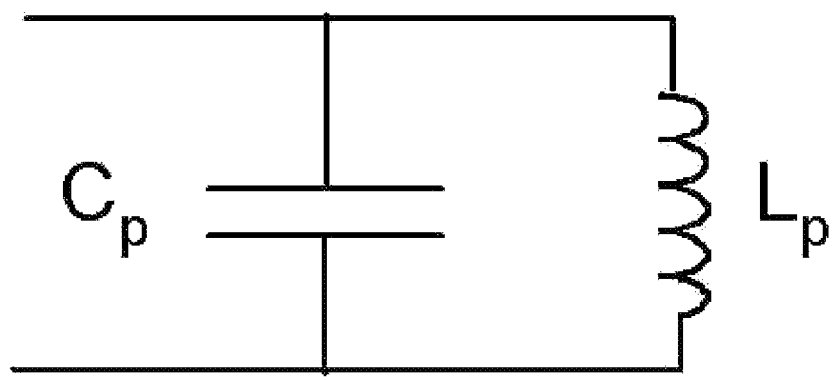

FIGS. 10c and 10d show series and parallel LC resonator arrangements, respectively. LC resonators that are not part of a BAW stack (e.g., the parallel resonator PR of FIG. 10a) may be configured as shown in FIG. 10c or 10d.

FIG. 11 shows, in schematic cross-section, an embodiment of a resonator stack and an additional BAW resonator. The resonator stack includes, from bottom to top, a first electrode E1, a first piezoelectric layer PS1, a second electrode E2, a coupling layer KS1, a third electrode E3, a second piezoelectric layer PS2 and a fourth electrode E4. The resonator stack forms two resonators arranged one on top of the other and coupled with one another by the coupling layer (corresponding to SR1 and SR2 in FIG. 10a), and is connected between ports P1 and P2. The parallel branch of the circuit is formed by an additional resonator, that includes a third piezoelectric layer PS3 and electrodes E5 and E6 surrounding it. Electrodes E2 and E3 are connected to electrode E5. Here, electrode E6 is connected to ground. It is also possible that it be connected to another circuit not shown here.

FIG. 12a shows the circuit diagram of a connection of a resonator stack in the series branch and another resonator stack in the parallel branch between ports P1 and P2. The first resonator stack includes two resonators SR1 and SR2 connected in series. The second resonator stack includes two resonators PR1 and PR2 connected in series. An example of a realization of this circuit is shown in schematic cross-section in FIG. 12b. The first resonator stack is constructed as shown in FIG. 10b. The second resonator stack includes, from bottom to top, an electrode E6 (connected to ground, for example), a piezoelectric layer PS3, a center electrode E5, that is electrically connected to electrode E2 of the first resonator stack, a piezoelectric layer PS4 and an electrode E7 (connected to ground, for example).

Though not specifically shown in the figure, the (lower) resonators are, in this case, also arranged on a carrier substrate, where an air gap or an acoustic mirror is provided, in each case, between the carrier substrate and resonator.

In the interest of clarity, only a few embodiments are described; however, the claims are not limited to these. Other variations are possible, especially in light of the possible combinations of the basic elements and arrangements presented above, as well as the number of layers in said layer regions of the resonator. The claims are not limited to a specific frequency range or a specific scope of application. Each of the layers of the resonator (e.g., the piezoelectric layer or the electrode) can have a multilayer structure. The resonator can also contain a plurality of (e.g., possibly non-adjacent) piezoelectric layers or more than only two electrodes.

The electrical connections (including the connections to ground) in the exemplary embodiments described can contain discrete elements, such as inductive resistors, capacitors, delay lines or matching networks.

What is claimed is:

1. A filter comprising resonators for use with bulk acoustic waves, each of the resonators for use with bulk acoustic waves comprising:
  a lower layer region comprising a first electrode;
  an upper layer region comprising a second electrode; and
  a piezoelectric layer between the first electrode and the second electrode;
wherein two of the resonators are in a stacked crystal filter arrangement, the two of the resonators comprising two bulk acoustic wave resonators, the stacked crystal filter arrangement of the two bulk acoustic wave resonators comprising:
  piezoelectric layers between an upper electrode in the stacked crystal filter arrangement and a lower electrode in the stacked crystal filter arrangement; and
  a shared electrode among the piezoelectric layers in the stacked crystal filter arrangement;
wherein an additional resonator is connected to the stacked crystal filter arrangement so that a combination of the two resonators and the additional resonator form an element of a lattice-type filter or a ladder-type filter, the additional resonator comprising a bulk acoustic wave resonator or an inductive-capacitive (LC) resonator;
a capacitor in series or in parallel with one of the two resonators in the stacked crystal filter arrangement, and
a multilayer substrate, wherein the capacitor is integrated into the multilayer substrate, the capacitor comprising structured metal layers within the multilayer substrate.

2. The filter of claim 1, wherein the additional resonator comprises at least one passive inductive component and at least one passive capacitive component.

3. The filter of claim 1, wherein each of the upper layer region and the lower layer region comprises a plurality of layers.

4. The filter of claim 3, wherein a plurality of layers in the upper layer region comprises layers that include different materials, and a plurality of layers in the lower layer region comprises layers that include different materials.

5. The filter of claim 1, wherein at least one of the upper layer region and the lower layer region comprises an acoustic mirror, the acoustic mirror comprising at least two alternating layers having different acoustic impedances.

6. The filter of claim 5, wherein at least one layer of the acoustic mirror comprises an electrode layer.

7. The filter of claim 1, wherein there is an air gap between at least one of the resonators and the multilayer substrate.

8. The filter of claim 1, wherein the additional resonator is an LC resonator.

9. A duplexer comprising a filter according to claim 8.

10. A duplexer comprising a filter according to claim 8.

11. The filter of claim 1, wherein, for at least one of the resonators for use with bulk acoustic waves, an upper layer region and a lower layer region comprises a plurality of layers.

12. The filter of claim 11, wherein a plurality of layers in each upper layer region comprises layers that include different materials, and a plurality of layers in each lower layer region comprises layers that include different materials.

13. The filter of claim 11, wherein there is an air gap between at least one of the resonators and the multilayer substrate.

14. The filter of claim 1, wherein each upper layer region and each lower layer region comprises an acoustic mirror, each acoustic mirror comprising at least two alternating layers having different acoustic impedances.

15. The filter of claim 14, wherein at least one layer of each acoustic mirror comprises an electrode layer.

16. An electrical circuit comprising:
  a substrate;
  a stack of resonators;
  an acoustic mirror between the substrate and the stack of resonators;
  wherein the stack of resonators comprises:
    first resonators that operate with bulk acoustic waves, the first resonators comprising an upper resonator and a lower resonator, the upper resonator and the lower resonator comprising upper and lower electrodes; and
    a coupling layer between an upper electrode of the lower resonator and a lower electrode of the upper resonator;
  a second resonator comprising electrodes;
  wherein the upper electrode of the lower resonator and the lower electrode of the upper resonator are electrically connected to an electrode of the second resonator;
  wherein the electrical circuit further comprises a capacitor in parallel with at least one of the resonators or in series with at least one of the resonators;
  wherein the substrate comprises a multilayer substrate; and
  wherein the capacitor is integrated into the multilayer substrate the capacitor comprising structured metal layers within the multilayer substrate.

17. The electrical circuit of claim 16, wherein an electrode of the second resonator is connected to ground.

18. The electrical circuit of claim 16, wherein the second resonator comprises a single resonator, the single resonator comprising a lower electrode, an upper electrode, and a piezoelectric layer between the upper electrode and the lower electrode.

* * * * *

UNITED STATES PATENT AND TRADEMARK OFFICE
CERTIFICATE OF CORRECTION

PATENT NO. : 7,616,079 B2 Page 1 of 1
APPLICATION NO. : 10/530507
DATED : November 10, 2009
INVENTOR(S) : Pasi Tikka It is certified that error appears in the above-identified patent and that said Letters Patent is hereby corrected as shown below:

Title page, Column 1, Inventor Pasi Tikka:
Delete "Munich" and Insert -- Unterhaching --

Title page, Column 1, Inventor Stommer:
Delete "Neuhiberg" and Insert -- Neubiberg --

Column 10, Claim 16, Lines 39-40:
Delete "substrate" and Insert -- substrate, --

Signed and Sealed this

Fifteenth Day of June, 2010

David J. Kappos
*Director of the United States Patent and Trademark Office*